(12) United States Patent
Banerjee et al.

(10) Patent No.: US 8,756,025 B2
(45) Date of Patent: Jun. 17, 2014

(54) TEMPERATURE SENSING OF ELECTRIC BATTERIES

(75) Inventors: Neel Banerjee, Corvallis, OR (US); Anton Nicholas Clarkson, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 445 days.

(21) Appl. No.: 13/008,172

(22) Filed: Jan. 18, 2011

(65) Prior Publication Data
US 2012/0185186 A1 Jul. 19, 2012

(51) Int. Cl.
*G01R 31/36* (2006.01)
*G06F 17/40* (2006.01)
*G06F 19/00* (2011.01)

(52) U.S. Cl.
USPC ............ 702/63; 73/865.8; 324/555; 374/152; 374/186; 702/132; 702/182; 713/320; 713/324; 713/340

(58) Field of Classification Search
CPC .......... G01D 21/00; G01K 1/00; G01K 1/02; G01K 1/022; G01K 7/00; G01K 7/04; G01K 7/16; G01K 7/22; G01K 2007/00; G01K 2007/16; G01R 31/00; G01R 31/36; G01R 31/3606; G01R 2031/00; G01R 2031/36; G06F 11/00; G06F 11/30; G06F 11/32; G06F 17/00; G06F 17/40; G06F 19/00; H01T 2200/00; H01T 2200/10
USPC ........... 73/432.1, 865.8, 865.9; 324/500, 555; 340/500, 540, 635, 636.1, 636.19; 361/1, 103, 105, 106; 374/100, 102, 374/141, 152, 186, E7.001, E7.004, 374/E1.001, E1.002, E1.003; 702/1, 33, 34, 702/57, 60, 63, 127, 130, 132, 182, 189; 708/100, 105, 200; 713/300, 320, 324, 713/340
IPC ............... G01D 21/00; G01K 1/00,1/02, 1/022, G01K 7/00, 7/02, 7/04, 7/16, 7/22, 2007/00; G01K 2007/16; G01R 31/00, 31/36, 31/3606, G01R 2031/00, 2031/36; G06F 11/00, 11/30, G06F 11/32, 17/00, 17/40, 19/00; H01M 2200/00, 2200/10
See application file for complete search history.

(56) References Cited

U.S. PATENT DOCUMENTS

| 4,707,795 | A | * | 11/1987 | Alber et al. ...................... 702/63 |
| 5,281,955 | A | * | 1/1994 | Reich et al. .............. 340/636.12 |
| 5,332,315 | A | * | 7/1994 | Baker et al. ................... 374/102 |
| 5,633,573 | A | | 5/1997 | van Phuoc et al. |
| 6,777,915 | B2 | | 8/2004 | Yoshizawa et al. |
| 7,199,557 | B2 | | 4/2007 | Anbuky et al. |
| 7,856,328 | B2 | | 12/2010 | Barsoukov et al. |
| 2010/0164430 | A1 | | 7/2010 | Lu et al. |
| 2011/0248678 | A1 | * | 10/2011 | Wade et al. ................... 320/119 |

FOREIGN PATENT DOCUMENTS

GB 2399701 9/2004

* cited by examiner

*Primary Examiner* — Edward Cosimano

(57) ABSTRACT

Methods and apparatus are provided related to thermal protection of electrical batteries. A sensor senses the temperature of a battery and a corresponding digital signal is digitally derived. Date, time and temperature data are written to storage media. A time-rate-of-change of the battery's temperature is determined and used to establish operational periodicity. Stored digital data can be communicated to another entity, temperature or time-rate-of-change values used to trigger an alarm or system shut-down, and so on. Electronic circuitry toggles between an active mode and a power-conserving sleep mode in accordance with periodic operating schedule.

14 Claims, 3 Drawing Sheets

TEMPERATURE SENSING OF ELECTRIC BATTERIES

BACKGROUND

Various devices and apparatus operate by way of electrical batteries. Temperature within a battery or batteries is an important factor in some such devices. In particular, excessive temperatures can cause material decomposition or other degradation of the battery leading to diminished performance or even catastrophic failure. The present teachings address the foregoing and other concerns.

BRIEF DESCRIPTION OF THE DRAWINGS

The present embodiments will now be described, by way of example, with reference to the accompanying drawings, in which.

DETAILED DESCRIPTION

Introduction

Methods and apparatus are provided related to protecting battery-containing apparatus, devices and systems. A sensor senses the temperature of a battery and corresponding digital data is provided. Date, time and the temperature data are written to a storage media. A time-rate-of-change of the battery's temperature is determined and used to establish operational periodicity.

Stored digital data can be communicated to another entity for using in taking protective action such as triggering an alarm, throttling back or shutting down a battery-powered system, identifying a specific battery for decommissioning, and so on. Electronic circuitry of the present teachings toggles between an active mode and a power-conserving sleep mode in accordance with a periodic operating schedule.

In one embodiment, an apparatus includes an electrical battery, and a sensor configured to provide an electrical signal correspondent to a temperature of the electrical battery. The apparatus also includes circuitry configured to quantify the electrical signal and to store digital data corresponding to the temperature and a timestamp. The circuitry is also configured to communicate the stored digital data to another entity.

In another embodiment, a method is performed using electronic circuitry. The method includes the steps of energizing components of the electronic circuitry in accordance with an active mode, and acquiring date and time information from a clock. The method also includes the steps of acquiring a temperature of a battery by way of a sensor. The method further includes storing digital data correspondent to the date and the time and the temperature into a storage media, and de-energizing components of the electronic circuitry in accordance with a sleep mode.

First Illustrative Device

Figure 1:
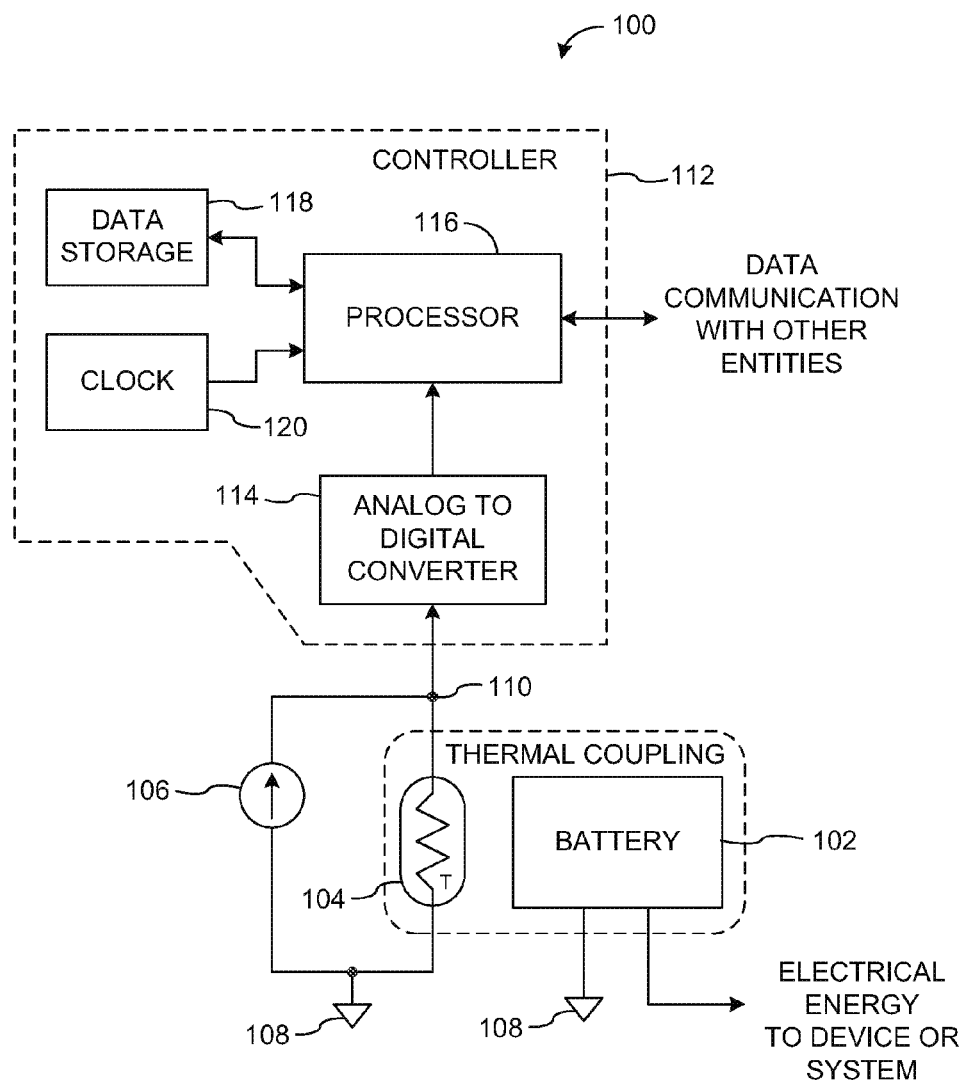
FIG. 1 is a block schematic view depicting a device according to one example.

Reference is now directed to FIG. 1, which depicts a block schematic view of a device 100. The device (or circuitry) 100 is also referred to as a battery thermal protection device. The device 100 is illustrative and non-limiting with respect to the present teachings. Thus, other circuits, apparatuses, devices or systems can be configured and operated in accordance with the present teachings.

The device 100 includes a battery 102. The battery 102 is also referred to as an electric battery 102 for purposes herein. In one example, the battery 102 is a lithium-ion (Li-ion) battery configured to store and provide electrical energy. In other respective examples, the battery 102 includes at least lithium iron phosphate, lithium iron sulfide, zinc, cobalt oxide, or lithium manganese cobalt oxide. In yet another example, the battery 102 includes a silicon anode. Other types of primary or secondary batteries can also be used.

The device 100 also includes a temperature sensor 104. The temperature sensor (sensor) 104 is configured to provide an electrical signal or exhibit an electrical characteristic that varies in accordance with temperature. In one example, the sensor 104 is a thermistor characterized by an electrical resistance that varies in accordance with temperature. Other suitable temperature sensors can also be used.

The sensor 104 is in thermal communication with the battery 102 and thus provides an electrical signal correspondent to a temperature of the battery 102. In one embodiment, the temperature sensor 104 is in surface contact with a case or packaging of the battery 102 and is held in place by adhesive tape. Other forms of bonding can also be used. In another example, the temperature sensor 104 is formed or defined integral to the battery, internally thereto or as a surface feature. Other configurations can also be used.

The device 100 further includes a current source 106. The current source 106 is configured to provide a regulated electrical current to the temperature sensor 104 by way of respective nodes 108 and 110. In one example, the current source 106 receives electrical energy by way of the battery 102 and provides a constant current to the sensor 104. In turn, a voltage signal is present between the nodes 108 and 110 correspondent to the temperature of the battery 102. Other suitable configurations can also be used. In one example, a temperature sensor provides digital data corresponding to battery temperature directly to a microcontroller or microprocessor, and the current source 106 is omitted. Other configurations can also be used.

The device 100 also includes a controller 112. The controller 112 includes an analog-to-digital converter (ADC) 114. The ADC 114 is configured to receive the voltage signal present at node 110 and to provide a digital quantification thereof. That is, the ADC 114 provides digital data (i.e., a byte or word) representative of an instantaneous value of the temperature of the battery 102.

The controller 112 also includes a processor 116. The processor 116 is configured to perform normal operations of the controller 112 in accordance with a computer-readable program code. In another example, the processor 116 is defined by a state machine, an application-specific integrated circuit (ASIC), digital logic, etc. Thus, various forms of electronic circuitry can be used to define the controller 116.

The processor 116 is coupled to a data storage media 118. In one example, the data storage media 118 is defined by a non-volatile storage memory or "flash" memory. Other suitable types of data storage media 118 can also be used. The processor 116 is configured to store digital data to and retrieve digital data from the data storage media 118.

The processor 116 is also coupled to a clock 120. The clock 120 is configured to provide time and date values to the processor 116. Respective time stamps, each including a time-of-day and date, can be stored as digital data within the data storage media 118 by the processor 116. The clock 120 can also be operated or accessed as a timer so that intervals of time (e.g., seconds, minutes, hours, and so on) can be measured. The processor 116 can therefore determine an instantaneous time and date, as well as measure intervals of time, by way of the clock 120.

The controller 112 is depicted as discrete functional blocks 114-120 in the interest of understanding the present teachings. However, the controller 112 can be defined, in whole or in part, by any suitable electronic constituency. In one example, the controller 112 is defined by a microcontroller operating in accordance with a program code and having built-in analog-to-digital conversion resources such that a discrete ADC 114 is not included. In another example, the controller 112 is defined, at least in part, by an application-specific integrated circuit. Other suitable embodiments can also be used. One having ordinary skill in the electronic circuitry or related arts can appreciate that the controller 112 can be variously defined and that such variations are contemplated by the present teachings.

Normal operations of the device 100, without imitation, proceed as follows: The battery 102 operates as a rechargeable electrical storage entity, providing electrical power to the balance of the device 100 or to other entities or electronic circuitry. The temperature sensor 104 is coupled or bonded in thermal communication with the battery 102 so as to sense the temperature thereof.

The processor 116 awakes from an energy-conserving sleep mode and assumes an active mode of operation. The processor 116 in turn energizes or "wakes" other components such as the current source 106, the ADC 114, and so on. The current source 106 provides regulated electrical current to the sensor 104, which provides an electrical signal to the ADC 114 correspondent to the temperature of the battery 102.

The ADC 114 digitally quantifies the temperature-related signal and provides corresponding digital data to the processor 116. The processor 116 accesses the clock 120 and receives time and date information for the present instant. The processor 116 then derives or constructs digital data including the temperature of the battery 102 and a timestamp and stores the digital data within the data storage media 118.

The processor 116 then returns other components to a sleep mode in the interest of energy conservation. The processor 116 also assumes a sleep mode itself, until the next temperature sensing and data storage operation is to be performed. Such sleep-active-sleep operational sequences are performed periodically in accordance with time intervals measured by way of the clock 120. Additional teachings specific to these time intervals and their determination are provided hereinafter.

First Illustrative Method

Figure 2A:
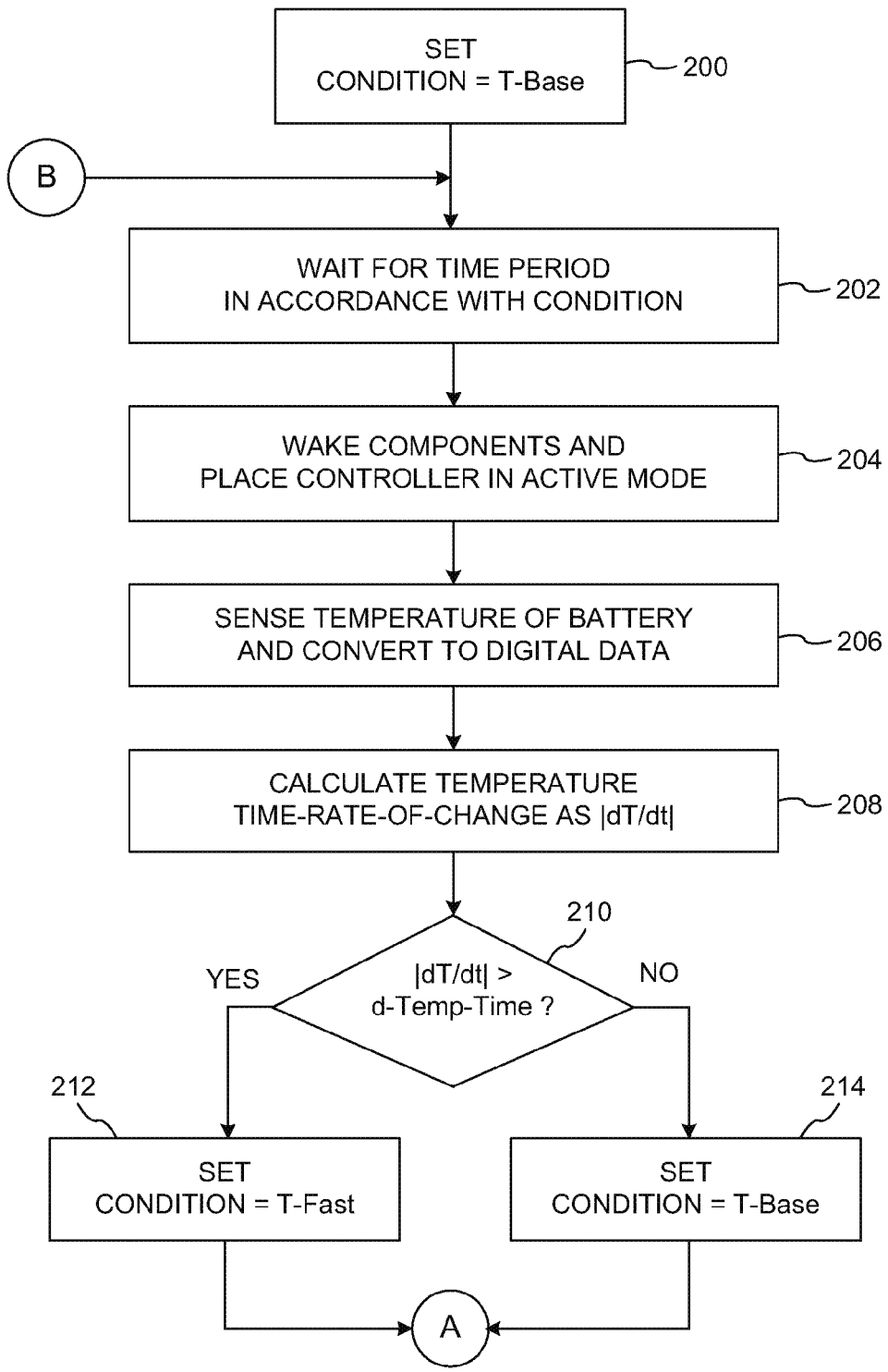
FIGS. 2A and 2B collectively provide a flow diagram depicting a temperature sensing and data storage method according to another example.
Figure 2B:
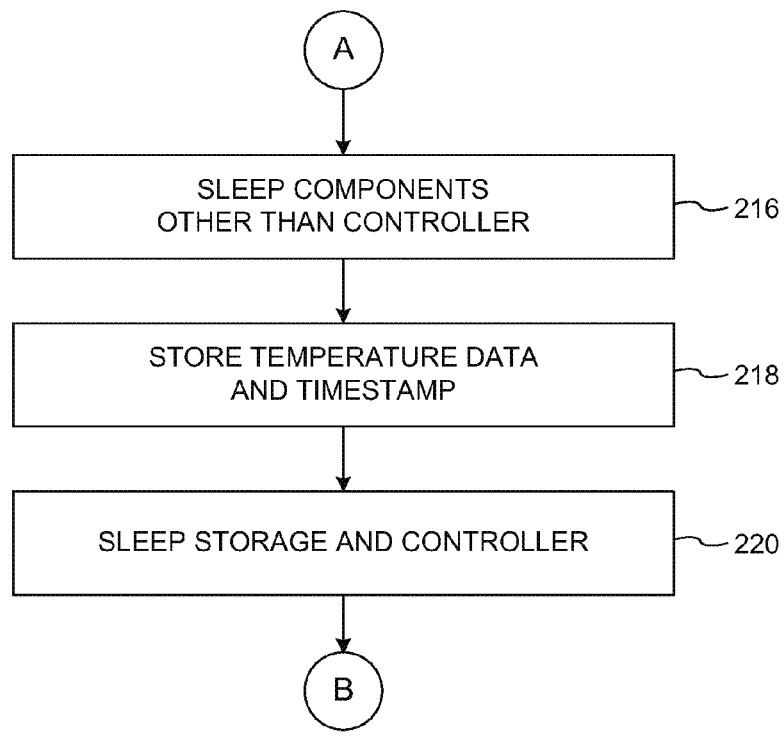

Attention is now directed to FIGS. 2A and 2B, which collectively depict a flow diagram of operations of a battery thermal protection method according to one example of the present teachings. The method of FIGS. 2A-2B includes particular operations and order of execution. However, other methods including other operations, omitting one or more of the depicted operations, or proceeding in other orders of execution can also be used according to the present teachings. Thus, the method of FIGS. 2A-2B is illustrative and non-limiting in nature. Reference is also made to FIG. 1 in the interest of understanding the method of FIGS. 2A-2B.

At 200, a controller for a battery protection device sets a condition variable equal to a value of another, predetermined variable T-Base. For purposes of illustration, it is assumed that the processor 116 retrieves a value "T-Base" from the data storage media 118. The processor 116 then sets a variable "CONDITION" equal to the value of T-Base. For purposes of non-limiting illustration, it is assumed that value of T-base is equal (or corresponds) to ten minutes.

At 202, the controller waits for a period of time in accordance with the value of the CONDITION variable. For purposes of the present illustration, the processor 116 accesses the clock 120 and awaits the elapse of a time period equal to the CONDITION variable in this example, ten minutes. No other significant operations are performed by the controller 112 during this wait period. Thus, the processor 116 and controller 112 are considered to be operating in a power conserving sleep mode.

At 204, the controller wakes various components and assumes an active mode of operation. In the present illustration, the processor 116 signals or energizes the current source 106 to provide energy to the temperature sensor 104. The processor 116 also signals or energizes the analog-to-digital converter 114 to assume an active mode. The processor 116 also accesses the clock 120 and gathers instantaneous date and time-of-day information as digital data.

At 206, the temperature of the battery is sensed and a corresponding signal is quantified as digital data. In the present illustration, the sensor 104 provides a voltage correspondent to the temperature of the battery 102 between nodes 108 and 110. The ADC 114 quantifies this voltage and provides corresponding digital data to the processor 116.

At 208, a time-rate-of-change of the temperature of the battery is calculated and the absolute value of that rate determined. For purposes of the present illustration, the processor 116 uses the temperature data derived at step 206 to calculate a time-rate-of-change (i.e., differential with respect to time) by way of a previous battery 102 temperature value and the time elapsed since that temperature was sensed. The rate is also referred to as |dT/dt| for purposes herein. For example, such a determination can be made in accordance with the following:

$$|dT/dt| = |(Tnew - Tprior)/time| \qquad \text{(Equation 1)}$$

Where:
|dT/dt|=Absolute Value of Time-Rate-of-Change;
Tnew=Present Temperature of Battery;
|Tprior=Prior Temperature of Battery; and
|time=Time Elapsed Between Tprior and Tnew At 210, the time-rate-of-change is compared to the value of a variable d-Temp-Time. In the present illustration, the processor 116 accesses the storage media 118 and retrieves a value for a variable "d-Temp-Time". The processor 116 then compares the value of d-Temp-Time with the value of |dT/dt| calculated at 208 above. If the value of |dT/dt| is greater than the value of d-Temp-Time, then the method proceeds to step 212 below. If the value of |dT/dt| is lesser than or equal to the value of d-Temp-Time, then the method proceeds to step 214 below.

At 212, the controller sets the CONDITION variable equal to a value of another, predetermined variable T-Fast. For purposes of illustration, it is assumed that the processor 116 retrieves a value "T-Fast" from the data storage media 118. The processor 116 then sets the variable CONDITION equal to the value of T-Fast. For purposes of non-limiting example, it is assumed that value of T-Fast is equal (or corresponds) to one minute. The method then proceeds to step 216 by way of connector node "A".

At 214, the controller sets the CONDITION variable equal to a value of the variable T-Base. For purposes of illustration, it is assumed that the processor 116 retrieves a value T-Base from the data storage media 118. The processor 116 then sets the CONDITION variable equal to the value of T-Base. The method then proceeds to step 216 by way of connector node "A".

At 216, the controller sets various components to a sleep mode of operation. In the present illustration, the processor 116 signals or de-energizes the current source 106 such that electrical energy is no longer provided to the temperature sensor 104. The processor 116 also signals or de-energizes the analog-to-digital converter 114 to assume an energy conserving sleep mode. Thus, at least some resources of the controller 112 are deactivated in the interest of electrical energy conservation while operating in the sleep mode.

At 218, the controller stores temperature and timestamp data in storage. In the present illustration, the processor 116 stores digital data, including the temperature, date and time-of-day, within data storage media 118.

At 220, the controller sets all presently active components and itself to a sleep mode of operation. For purposes of the present illustration, the processor 116 signals or de-energizes the data storage media 118 to a power conserving sleep mode. The processor 116 also assumes a sleep mode, maintaining operations of only those aspects needed to awake from sleep upon the end of a wait cycle. The method then returns to step 202 above by way of connector node "B". One complete operational instance of the method of FIGS. 2A-2B is now complete.

The method of FIGS. 2A-2B is typically performed in a repetitive, periodic manner at a rate or frequency correspondent to the time-rate-of-change (i.e., rate) of the temperature of the battery 102. If the rate is equal or lesser than a selectively programmable threshold value "d-Temp-Time", then the method is performed at a relatively lesser frequency (e.g., once every ten minutes). If the rate is greater than the threshold value, then the method is performed at a higher frequency (e.g., once per minute).

In general, and without limitation, the present teachings contemplate sensing the temperature of a battery or cell, and storing temperature and date and time information by way of a storage media. A time-rate-of-change of the battery temperature is also calculated and used to establish the periodic frequency of the temperature sensing and data storage operations. Selectively programmable variables (i.e., T-Base, T-Fast and d-Temp-Time) allow a user to calibrate the time period and threshold values used during operation.

Stored data can be communicated to another entity such as a microprocessor, a computer, a communications network and so on. Normal, energy-consuming operations of a device or system can be throttled or halted in the event that a temperature anomaly of the battery is detected. Such anomalies include excessive temperature, excessive rate-of-change in temperature, and so on. Damage to the battery or cell can thus be prevented or minimized by way of such protective operations.

The stored data can also be put to other uses. For example, the battery can be prevented from being discharged, or a system connected thereto can be instructed to limit the discharge current. In another example, the stored data can be used for signaling an internal battery charge controller (not shown) such that the battery won't be recharged as it is deemed to pose a potential safety hazard. The foregoing or other actions can be taken dependent upon the type of battery-powered device or the severity of an associated battery's excursion from specified environmental conditions.

First Illustrative Apparatus

Figure 3:
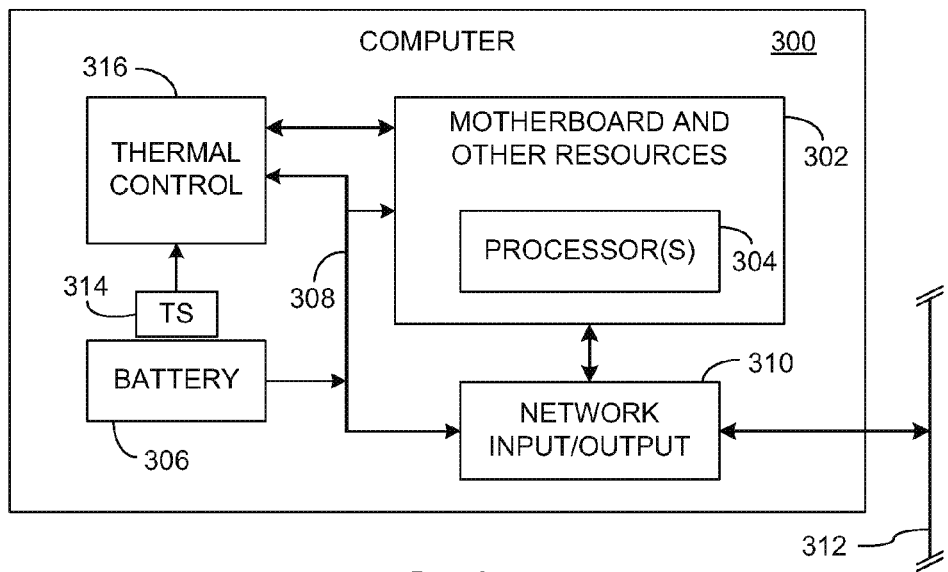
FIG. 3 is a block diagram depicting an illustrative computer according to another example.

Attention is now directed to FIG. 3, which depicts a block diagram of a computer 300 in accordance with the present teachings. The computer 300 is illustrative and non-limiting in nature. Any number of other apparatus, devices and systems are contemplated in accordance with the present teachings. Non-limiting examples of such entities include sensing or control instrumentation, seismic sensing devices, medical apparatus, electric vehicles, and so on.

The computer 300 includes a motherboard 302 having various resources incident to the normal operations of the computer 300. The motherboard 302 includes one or more processors 304 each configured operate in accordance with a program code (i.e., software). The motherboard 302 can include other resource such as, without limitation, storage media, power control circuitry, wireless communications resources, and so on. One having ordinary skill in the computer and related arts is familiar with computer motherboards and their various and respective characteristics, and further elaboration is not required for purposes of understanding the present teachings.

The computer 300 also includes a battery 306. The battery 306 is configured to store and provide electrical energy to the motherboard 302 and other resources by way of a power bus 308. In one example, the battery 306 is a lithium-ion battery. Other types of batteries can also be used. The computer 300 also includes network input/output (I/O) 310 configured to couple the motherboard 302 in bidirectional data communications with a network 312. The network input/output 310 receives electrical energy from the battery 306 by way of the power bus 308.

The computer 300 also includes a temperature sensor 314 in thermal communication with the battery 306. The temperature sensor 314 is configured to provide an electrical signal corresponding to the temperature of the battery 306. In one example, the temperature sensor 314 is a thermistor. In another example, the temperature sensor 314 is a digital temperature sensing device configured to provide digital data. Other temperature sensing devices can also be used.

The computer 300 also includes a thermal controller or temperature protection circuit (i.e., controller) 316. The controller 316 is configured to receive electrical energy from the battery 306 by way of the power bus 308. The controller 316 is also configured to operate in accordance with the method of FIGS. 2A-2B. Thus, the controller 316 is configured to receive the electrical signal from the temperature sensor 314, to store corresponding temperature and timestamp data within a storage media, and to communicate such data to the motherboard 302. In one example, the controller 316 is essentially equivalent to the controller 112. In another example, the controller 316 is defined by a microcontroller operating in accordance with a program code. Other suitable embodiments of the controller 316 can also be used.

The computer 300 is a non-limiting example of any number of devices and systems contemplated by the present teachings. In general, such devices and systems operate by way of an electrical battery and can be portable or stationary in their typical use. The temperature of the battery (or batteries) is sensed and corresponding digital data is stored in media. The date and time of each temperature sensing event is determined and a corresponding timestamp is also stored with the temperature data.

Time-rate-of-change of the battery temperature is also determined and compared to a threshold value. This comparison is used to establish a frequency or periodicity of the temperature sensing and data storage operations. Stored or presently sensed temperature and timestamp data can be communicated to another entity or network for use in acquisition, throttling or shutdown of battery-powered devices and circuits, and so on. Protection of a battery or batteries or the devices powered thereby against various types of failures or damage is contemplated by the present teachings.

In general, the foregoing description is intended to be illustrative and not restrictive. Many embodiments and applications other than the examples provided would be apparent to those of ordinary skill in the art upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future embodiments. In sum, it should be understood that the invention is capable of modification and variation and is limited only by the following claims.

What is claimed is:

1. An apparatus, comprising:
   an electrical battery;
   a sensor configured to provide an electrical signal correspondent to a temperature of the electrical battery; and
   circuitry configured to quantify the electrical signal and to store digital data corresponding to the temperature and a timestamp, the circuitry also configured to communicate the stored digital data to another entity, and the circuitry further configured to determine a time-rate-of-change of the temperature of the battery.

2. The apparatus according to claim 1 further comprising a current source configured to provide regulated electrical energy to the sensor, the sensor being defined by a thermistor.

3. The apparatus according to claim 1, the electrical battery including at least lithium, manganese, cobalt, silicon, iron, zinc, or phosphate.

4. The apparatus according to claim 1, the circuitry further configured to quantify the electrical signal and to store the digital data periodically according to a condition variable, the condition variable being settable to a plurality of respective values including a base value and a fast value.

5. The apparatus according to claim 1, the circuitry further configured to toggle between a sleep mode and an active mode periodically in accordance with the time-rate-of-change of the temperature of the battery, the circuitry configured to quantify the electrical signal and to store the digital data while operating in the active mode.

6. The apparatus according to claim 1, the circuitry further configured to operate by way of electrical energy received from the electrical battery.

7. The apparatus according to claim 1, the circuitry at least partially defined by a processor configured to operate in accordance with a computer-readable program code.

8. A system, comprising:
   a battery;
   a sensor in thermal communication with the battery; and
   a controller configured to determine the temperature of the battery by way of the sensor, the controller configured to store digital data including the temperature of the battery and a timestamp by way of a storage media, the controller configured to operate periodically in accordance with a time-rate-of-change of the temperature of the battery.

9. The system according to claim 8, the controller further configured to operate at a first periodicity when the time-rate-of-change of the temperature of the battery is equal to or lesser than a threshold value, the controller further configured to operate at a second periodicity faster than the first periodicity when the time-rate-of-change of the temperature of the battery is greater than the threshold value.

10. The system according to claim 8, the controller further configured to communicate the digital data stored within the storage media to another entity.

11. The system according to claim 8, the controller including at least a processor, a real time clock, or an analog-to-digital converter.

12. A method performed using electronic circuitry, comprising:
    energizing components of the electronic circuitry in accordance with an active mode;
    acquiring date and time information from a clock;
    acquiring a temperature of a battery by way of a sensor;
    storing digital data correspondent to the date and the time and the temperature into a storage media; and
    de-energizing components of the electronic circuitry in accordance with a sleep mode.

13. The method according to claim 12 further comprising:
    calculating a time-rate-of-change of the temperature of the battery;
    comparing the time-rate-of-change to a threshold value; and
    setting a condition variable to a particular value in accordance with the comparing.

14. The method according to claim 12 further comprising:
    waiting in the sleep mode for a period of time in accordance with a present value of a condition variable;
    performing the energizing and the acquiring and the storing and the de-energizing while in the active mode; and
    returning to the sleep mode and performing the waiting again.

* * * * *